United States Patent
Lee et al.

(10) Patent No.: US 9,552,879 B2
(45) Date of Patent: Jan. 24, 2017

(54) NONVOLATILE MEMORY DEVICE HAVING VARIABLE RESISTANCE MEMORY CELLS AND A METHOD OF RESETTING BY INITIALLY PERFORMING PRE-READ OR STRONG SET OPERATION

(71) Applicant: SAMSUNG ELECTRONICS CO., LTD., Suwon-Si, Gyeonggi-Do (KR)

(72) Inventors: Yongkyu Lee, Hwaseong-Si (KR); Yeongtaek Lee, Seoul (KR); Youngbae Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1 day.

(21) Appl. No.: 14/505,523

(22) Filed: Oct. 3, 2014

(65) Prior Publication Data

US 2015/0243353 A1 Aug. 27, 2015

(30) Foreign Application Priority Data

Feb. 21, 2014 (KR) .................... 10-2014-0020615

(51) Int. Cl.
*G11C 11/00* (2006.01)
*G11C 13/00* (2006.01)
*G11C 11/56* (2006.01)

(52) U.S. Cl.
CPC ....... *G11C 13/0097* (2013.01); *G11C 13/0069* (2013.01); *G11C 11/5614* (2013.01); *G11C 11/5685* (2013.01); *G11C 13/0064* (2013.01); *G11C 2013/0076* (2013.01)

(58) Field of Classification Search
None
See application file for complete search history.

(56) References Cited

U.S. PATENT DOCUMENTS

| | | | |
|---|---|---|---|
| 7,522,449 B2 | 4/2009 | Ro et al. | |
| 7,646,632 B2 | 1/2010 | Philipp et al. | |
| 8,045,370 B2 | 10/2011 | Zhu et al. | |
| 8,315,113 B2 | 11/2012 | Yoon | |
| 8,351,240 B2 | 1/2013 | Park et al. | |
| 8,369,151 B2 | 2/2013 | Yoneya et al. | |
| 8,493,776 B1 | 7/2013 | Yu et al. | |
| 2008/0062740 A1 | 3/2008 | Baek et al. | |
| 2009/0244962 A1* | 10/2009 | Gordon | G11C 8/10 365/163 |
| 2010/0027326 A1* | 2/2010 | Kim | G11C 13/0069 365/163 |
| 2010/0103726 A1* | 4/2010 | Bae | G11C 5/143 365/163 |
| 2010/0110779 A1* | 5/2010 | Liu | G11C 8/10 365/163 |
| 2012/0243307 A1* | 9/2012 | Takashima | H01L 27/2436 365/163 |

(Continued)

*Primary Examiner* — Richard Elms
*Assistant Examiner* — Sultana Begum
(74) *Attorney, Agent, or Firm* — Volentine & Whitt, PLLC

(57) ABSTRACT

A method of resetting a variable resistance memory cell in a nonvolatile memory device includes; programming the memory cell to a set state using a corresponding compliance current, and then programming the memory cell to a reset state by pre-reading the variable resistance memory cell to determine its resistance and resetting the memory cell using a variable reset voltage determined in response to the determined resistance.

19 Claims, 9 Drawing Sheets

(56) References Cited

U.S. PATENT DOCUMENTS

2013/0051123 A1    2/2013   Lee et al.
2013/0223133 A1    8/2013   Azuma et al.
2015/0006836 A1*   1/2015   Terada ................ G06F 9/4418
                                                                      711/162

* cited by examiner

NONVOLATILE MEMORY DEVICE HAVING VARIABLE RESISTANCE MEMORY CELLS AND A METHOD OF RESETTING BY INITIALLY PERFORMING PRE-READ OR STRONG SET OPERATION

CROSS-REFERENCE TO RELATED APPLICATIONS

A claim of priority has been made under 35 U.S.C. §119 to Korean Patent Application No. 10-2014-0020615 filed Feb. 21, 2014, the subject matter of which is hereby incorporated by reference.

BACKGROUND

The inventive concept relates generally to nonvolatile memory devices and method of programming same. More particularly, the inventive concept relates to nonvolatile memory devices having variable resistance memory cells and methods of resetting same.

There is an increasing need for a nonvolatile semiconductor memory devices capable of realizing high integration and large data storage capacity. In particular, research has been directed to different types of nonvolatile memory devices that enable random data access. Such nonvolatile memory devices include the ferroelectric RAM (FRAM) that uses a ferroelectric capacitor, the magnetic RAM (MRAM) that uses a tunneling magneto-resistive film, the phase change memory device (PRAM) that uses Chalcogenide alloys, and the resistive RAM (RRAM) that uses a variable resistance material film as a data storage medium.

Of these, the RRAM characterized by high operating speeds, large data storage capacity, and low operating power. Thus, a great deal of ongoing research is directed to improvements in RRAM performance. As will be appreciated by those skilled in the art, the variable resistance material film of the RRAM exhibits a reversible resistance variation according to the polarity or amplitude of an applied control pulse. Examples of contemporary variable resistance material films include certain Colossal Magnetro-Resistive (CMR) materials with a Perovskite structure, and certain metal oxides forming a conductive filament.

SUMMARY

In one aspect, certain embodiments of the inventive concept are directed to a method of programming a variable resistance memory cell in a nonvolatile memory device. The method comprises; programming the variable resistance memory cell to one of a plurality of set states using a corresponding one of a plurality of compliance currents, and thereafter, programming the variable resistance memory cell to a reset state by pre-reading the variable resistance memory cell to determine the resistance of the variable resistance memory cell, and resetting the variable resistance memory cell using a variable reset voltage determined in response to the determined resistance of the variable resistance memory cell.

In another aspect, certain embodiments of the inventive concept are directed to a method of programming a variable resistance memory cell in a nonvolatile memory device. The method comprises; programming the variable resistance memory cell to one of a plurality of set states using a corresponding one of a plurality of compliance currents, and thereafter, programming the variable resistance memory cell to a reset state by first programming the variable resistance memory cell to a strong set state and then resetting the variable resistance memory cell to the reset state from the strong set state using a constant reset voltage.

In another aspect, certain embodiments of the inventive concept are directed to a method of programming a variable resistance memory cell in a nonvolatile memory device. The method comprises; programming the variable resistance memory cell to one of a plurality of set states using a corresponding one of a plurality of compliance currents, and thereafter, programming the variable resistance memory cell to a reset state by pre-reading the variable resistance memory cell to determine the resistance of the variable resistance memory cell, programming the variable resistance memory cell to a strong set state and then resetting the variable resistance memory cell to the reset state from the strong set state using a constant reset voltage.

BRIEF DESCRIPTION OF THE FIGURES

The above and other objects and features will become apparent from the following description with reference to the following figures, wherein.

DETAILED DESCRIPTION

Figure 1:
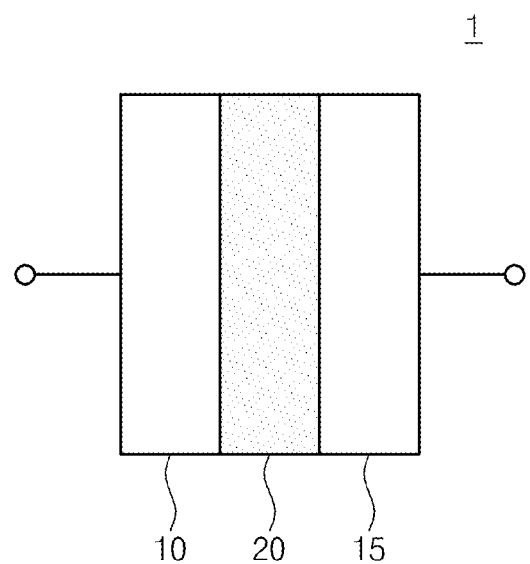
FIG. 1 is a diagram illustrating one element structure for a variable resistance memory device.

Certain embodiments of the inventive concept will now be described in some additional detail with reference to the accompanying drawings. The inventive concept may, however, be embodied in different forms and should not be construed as being limited to only the illustrated embodiments. Rather, these embodiments are provided as examples so that this disclosure will be thorough and complete, and will fully convey the concept of the inventive concept to those skilled in the art. Unless otherwise noted, like reference numerals and labels denote like or similar elements throughout the attached drawings and written description. In the drawings, the various sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a diagram illustrating one possible structure of a variable resistance memory device. Referring to FIG. 1, a variable resistance element 1 comprises a pair of electrodes 10 and 15 sandwiching a data storage film 20.

The electrodes 10 and 15 may include one or more metals, metal oxides, and/or metal nitrides. For example, the electrodes 10 and 15 may be made up of aluminum (Al), copper (Cu), titanium nitride (TiN), titanium aluminum nitride (TixAlyNz), iridium (Ir), platinum (Pt), argentum (Ag), aurum (Au), poly silicon, tungsten (W), titanium (Ti), tantalum (Ta), tantalum nitride (TaN), tungsten nitride (WN), nickel (Ni), cobalt (Co), chromium (Cr), stibium (Sb), iron (For example), molybdenum (Mo), palladium (Pd), tin (Sn), zirconium (Zr), zinc (Zn), iridium oxide (IrO2), and strontium zirconate oxide (StZrO3).

The data storage film 20 may be made up of one or more unipolar or bipolar resistance memory material(s). Here, the term "bipolar resistance memory material" refers to a material capable of being programmed to a set state or a reset state in accordance with the opposing magnetic polarities of an applied control pulse. Examples of a bipolar resistance memory material include Perovskite-like materials. In contrast, the term "unipolar resistance memory material" refers to a material capable of being programmed to a set state or a reset state in accordance with a control pulse having a single magnetic polarity. Examples of a unipolar resistance memory material include such single transition metallic oxides as NiOx or TiOx.

Figure 2:
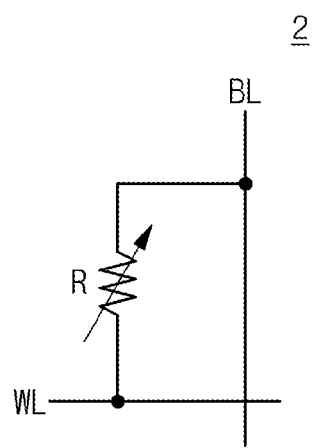
FIG. 2 shows a variable resistance memory cell lacking a selection element.
Figure 3:
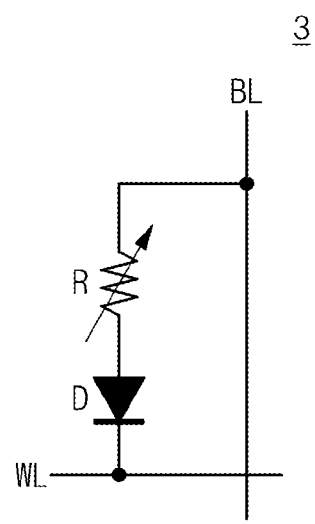
FIG. 3 shows a variable resistance memory cell including a selection element.

FIGS. 2 and 3 are respective circuit diagrams illustrating memory cell structures for a variable resistance memory device.

FIG. 2 shows a variable resistance memory cell 2 that does not include a selection element. The variable resistance memory cell 2 includes a variable resistance element R connected between a bit line BL and a word line WL. Here, data may be programmed (or written) using a voltage applied between the bit line BL and word line WL.

FIG. 3 shows a variable resistance memory cell 3 that includes a selection element. The variable resistance memory cell 3 includes a variable resistance element R and a diode D (e.g., a bidirectional diode or alternately a transistor) used as a selection element.

The variable resistance element R comprises one or more material(s) capable of exhibiting a range of programmable resistances (e.g., assuming a binary variable resistance memory cell—a set state having a characteristic set resistance and a reset state having a characteristic reset resistance different from the set resistance). These different resistances may be used to indicate corresponding data values (e.g., values "0" and "1", again assuming a binary variable resistance memory cell). In the illustrated example of FIG. 3, the diode D is used as a selection element (or switching element) that selectively provides or blocks an electrical current with respect to the variable resistance element R and according to a voltage bias between the word line WL and bit line BL.

In FIG. 3, the diode D is connected between the variable resistance element R and the word line WL, and the variable resistance element R is connected between the bit line BL and the diode D. However, the respective positions of the diode D and variable resistance element R may be switched.

The diode D is turned ON/OFF according to a voltage applied to a selected word line WL. But the variable resistance memory cell 3 of FIG. 3 is not driven, if a voltage exceeding a predetermined level is applied to an unselected word line.

Figure 4:
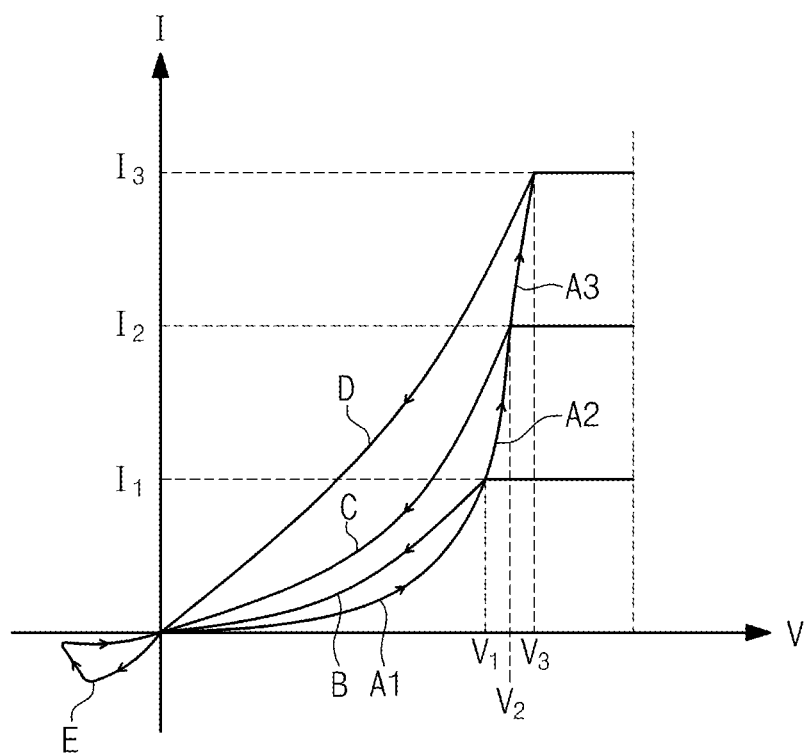
FIGS. 4, 5 and 6 are respective graphs illustrating various hysteresis characteristics for a variable resistance memory cell that may be used in certain embodiments of the inventive concept, as well as corresponding set and reset states.

FIG. 4 is a graph illustrating a voltage/current relationship indicating a hysteresis characteristic of a variable resistance memory cell according to an embodiment of the inventive concept. Referring to FIG. 4, a variable resistance memory cell according to the inventive concept exhibits different hysteresis characteristics according to the intensity (or "level") of compliance current. That is, the variable resistance memory cell may be programmed to different set state resistances according to the level of an applied compliance current.

In view of the different hysteresis characteristics and the corresponding current/voltage time periods illustrated in FIG. 4, a method of programming a variable resistance memory cell (i.e., switched from a set state (or relatively low-resistance state) to a reset state (or a relatively high-resistance state) will be described.

First, it should be understood that a variable resistance memory cell may be programmed to a reset state (or high-resistance state) by increasing the level of the voltage V applied across it. That is, the current-voltage characteristic of the variable resistance memory cell having a given polarity in accordance with the voltage applied across while being programmed to the reset state will vary in accordance with the level of the applied voltage. This current-voltage relationship (or "characteristic") over a given time period is referred to as a hysteresis characteristic.

One current-voltage characteristic for the exemplary variable resistance memory cell of FIG. 4 follows curve A1 when the voltage applied across it increases in a state induced by a first compliance current (I1). However, after reaching the level of the first compliance current I1, the current of the variable resistance memory cell will not increase any further. Thereafter, only the voltage applied across the variable resistance memory cell increases. So, although the voltage applied across the variable resistance memory cell increases, the first compliance current I1 is maintained at a constant level. Hence, when a variable resistance memory cell is programmed to a reset state under the foregoing conditions, a voltage having an opposite polarity may be applied. In this case, a current-voltage characteristic may vary along curve B.

Where a voltage applied across the variable resistance memory cell increases in a state using a second compliance current I2, the current-voltage characteristic follows curve A1-A2. However as before, after reaching the second compliance current I2, the current of the variable resistance memory cell will not increase further, but only the voltage applied across is will increase. Here, although the voltage applied across the variable resistance memory cell increases, the second compliance current I2 is maintained at a constant level. And assuming that the variable resistance memory cell is programmed to a reset state under the above conditions, but a voltage having an opposite polarity is applied, the current-voltage characteristic of the variable resistance memory cell will vary along curve C.

Finally, with respect to FIG. 4, when the voltage applied across the variable resistance memory cell increases in a state using a third compliance current I3, the current-voltage characteristic follows curve A1-A2-A3. Again, after reaching the third compliance current I3, the current of a variable resistance memory cell will not increase further, but the voltage applied across it will increase. Here, although the voltage applied across the variable resistance memory cell increases, the third compliance current I3 is maintained at a constant level. Assuming that the variable resistance memory cell is programmed to a reset state under the above conditions using a voltage having the opposite polarity, the current-voltage characteristic of the variable resistance memory cell will vary along curve D.

Further in the foregoing example, the programming of the variable resistance memory cell to a set state is illustrated by curve E.

As may be understood from the illustrated example of FIG. 4, where a reset state is programmed using different compliance currents I1, I2, and I3, different current-voltage characteristics for the variable resistance memory cell may be obtained.

Figure 5:
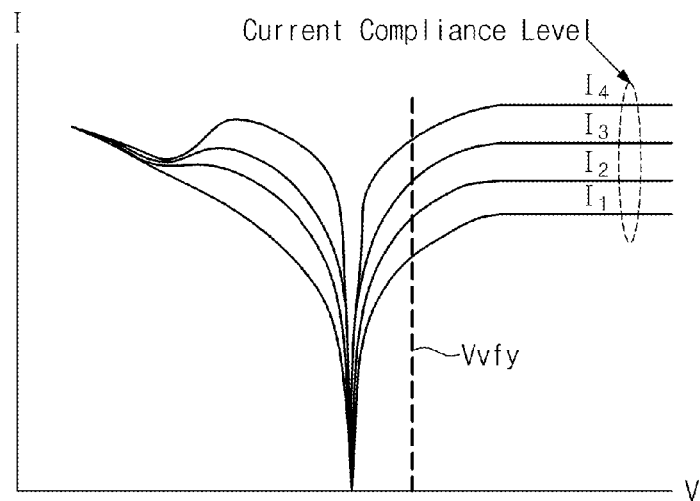

FIG. 5 is a another graph illustrating different hysteresis characteristics for a variable resistance element of a variable resistance memory cell. FIG. 5 is drawn using a logarithmic scale and shows different hysteresis characteristics for the variable resistance memory cell when "set" using different levels of compliance currents I1, I2, I3, and I4 and a voltage is applied.

Referring to FIG. 5, a variable resistance memory cell that is programmed to the set state using different compliance currents I1, I2, I3, and I4 will exhibit different set state resistance values. So, as a result, different levels of current will pass through the variable resistance memory cell in response to the same verification voltage applied during a read or verification operation, for example. Also, when the variable resistance memory cell having the set state is programmed to the reset state using a reset voltage, a resistance distribution for the variable resistance memory cell is formed to be constantly spaced apart from the set state resistance distribution.

Figure 6:
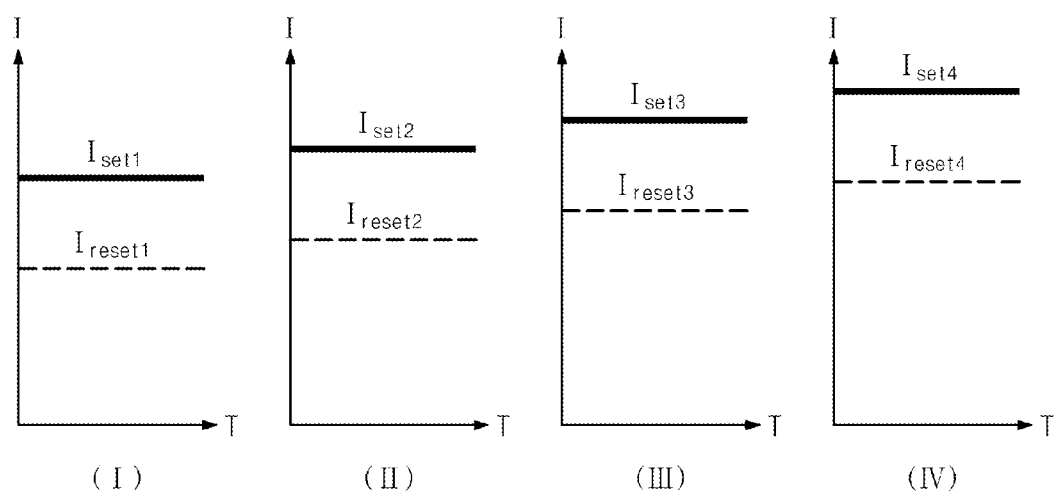

In this regard, FIG. 6 is a set of graphs variously illustrating currents flowing through a variable resistance memory cell programmed in different set and reset states in response to the same applied voltage, assuming that the variable resistance memory cell has been programmed to the set state using different compliance currents. That is, in FIG. 6, graph (I) shows set and reset currents of the variable resistance memory cell programmed to a set state using a first compliance current; graph (II) shows set and reset currents of the variable resistance memory cell programmed to a set state using a second compliance current greater than the first compliance current; graph (III) shows set and reset currents of the variable resistance memory cell programmed to a set state using a third compliance current greater than the second compliance current; and graph (IV) shows set and reset currents of the variable resistance memory cell programmed to a set state using a fourth compliance current greater than the third compliance current.

As may be seen from FIG. 6, the greater the intensity (or higher the level) of the compliance current, the relatively higher the set state current of the variable resistance memory cell will be. That is, as the level of compliance current increases, the variable resistance memory cell is programmed to have a relatively lower resistance value in the set state.

Also, when programming the variable resistance memory cell to the reset state by applying the same reset voltage to the variable resistance memory cell programmed to a set state where different levels of compliance currents are provided, a resistance distribution for the variable resistance memory cell is formed that is constantly spaced apart from a set state resistance distribution. Thus, a variable resistance memory cell programmed to the set state using a relatively lower level compliance current must be discriminated using an applied voltage that takes the foregoing discussion into account. Otherwise, a sensing error may arise during a subsequent read or verification operation.

Figure 7:
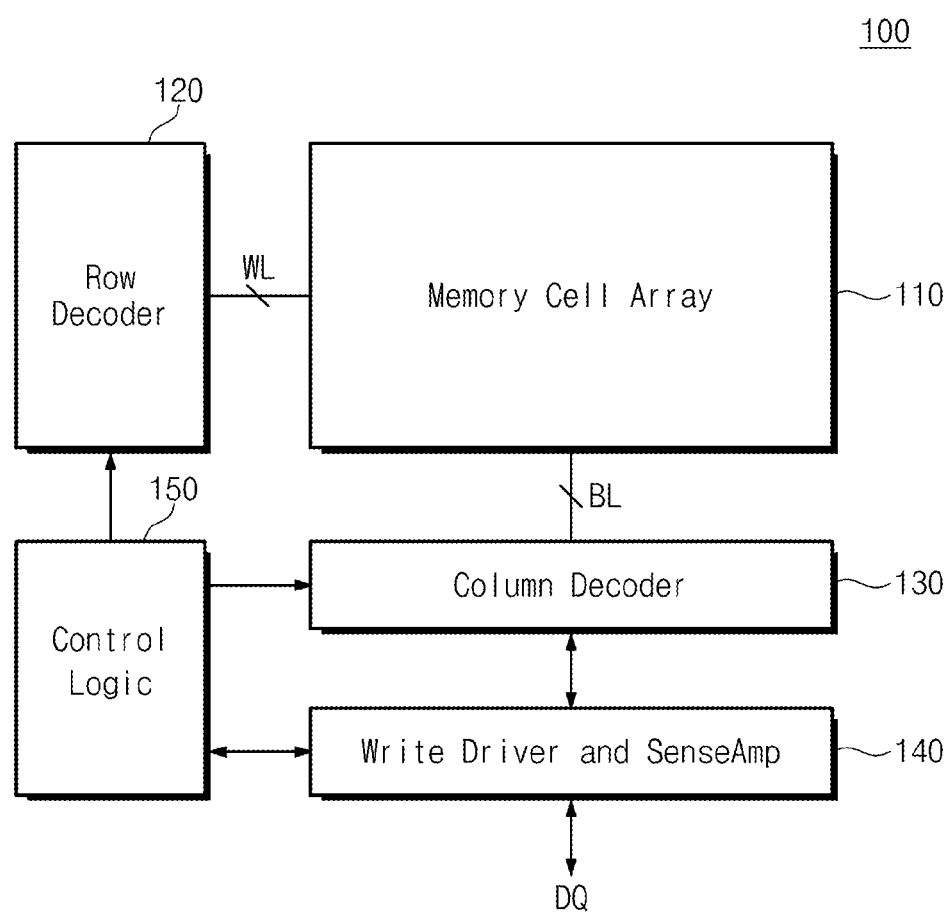
FIG. 7 is a block diagram illustrating a nonvolatile memory device according to embodiments of the inventive concept.

FIG. 7 is a block diagram illustrating a nonvolatile memory device according to an embodiment of the inventive concept. Referring to FIG. 7, a nonvolatile memory device 100 comprises a memory cell array 110, a row decoder 120, a column decoder 130, a write driver and sense amplifier block 140, and control logic 150.

During a reset operation directed to a selected variable resistance memory cell of the memory cell array 110 (hereafter, "memory cell"), the nonvolatile memory device 100 is configured to perform a "pre-read operation" before programming the memory cell to a reset state. Using this approach, the nonvolatile memory device 100 may appropriately define a reset voltage to be applied during the reset operation based on the results of the pre-read operation. Here, consistent with the foregoing, the nonvolatile memory device 100 is assumed to program variable resistance memory cells previously programmed to a set state using different compliance currents to a reset state using the above-described approach.

The memory cell array 110 comprises a plurality of variable resistance memory cells. In certain embodiments of the inventive concept, the variable resistance memory cells included in the memory cell array 110 will be similar to one of variable resistance memory cells described in relation to FIGS. 2 and 3. A program voltage or a verification voltage may be applied to the variable resistance element of a variable resistance memory cell via a word line and a bit line.

According to certain embodiments of the inventive concept, the memory cell array 110 will be arranged in a two-dimensional planar structure. Alternatively, the memory cell array 110 may arranged in a three-dimensional structure, comprising, for example, word line planes WL stacked in a vertical direction and channels or bit lines also running in the vertical direction. An electrode and a data storing film may be formed between each word line plane and channel connected to a bit line.

The row decoder 120 decodes a received row address to select one of multiple word lines of the memory cell array 110. The row decoder 120 supplies a ground voltage to a selected word line and an inhibition voltage for blocking a leakage current to unselected word lines.

The column decoder 130 selects at least one of multiple bit lines of the memory cell array 110 based on a column address. A bit line selected by column decoder 130 is connected to the write driver and sense amplifier block 140.

Under the control of the control logic 150, the write driver and sense amplifier block 140 writes input data in the memory cell array 110 or reads data from the memory cell array 110 to output it to an external device.

During a write (or program) operation, the write driver and sense amplifier block 140 supplies a program voltage to a selected bit line. The write driver and sense amplifier block 140 provides various levels of compliance currents Ic when a memory cell is programmed from a reset state corresponding to a high-resistance state to a set state corresponding to a low-resistance state.

Under the control of the control logic 150, the write driver and sense amplifier block 140 performs a pre-read operation on a selected memory cell when the memory cell is programmed from the set state (a low-resistance state) to the reset state (a high-resistance state). Thus, the write driver and sense amplifier block 140 may be used to provide reset voltages (Vreset) having different levels based on a results of the pre-read operation.

Thus, according to certain embodiments of the inventive concept, the level of the reset voltage applied by the write driver and sense amplifier block 140 may be determined based on the level of the applied compliance current. For example, the write driver and sense amplifier block 140 may provide the memory cell array 110 with one of 'N' compliance currents during a set operation, and accordingly, the write driver and sense amplifier block 140 may provide the memory cell array 110 with one of 'N' reset voltages during a reset operation.

The control logic 150 controls the row decoder 120, the column decoder 130, and the write driver and sense amplifier block 140 in response to a write or read command from an external device.

Thus, in certain embodiments of the inventive concept, the control logic 150 may be used to control the write driver and sense amplifier block 140 such that the level of the reset voltage Vreset is relatively low when the resistance value of the memory cell, as read during the pre-read operation, is relatively high.

In this manner, the nonvolatile memory device 100 may be used to appropriately program memory cells having previously been programmed using to the set state using different compliance currents into the same reset state using the pre-read operation.

Figure 8:
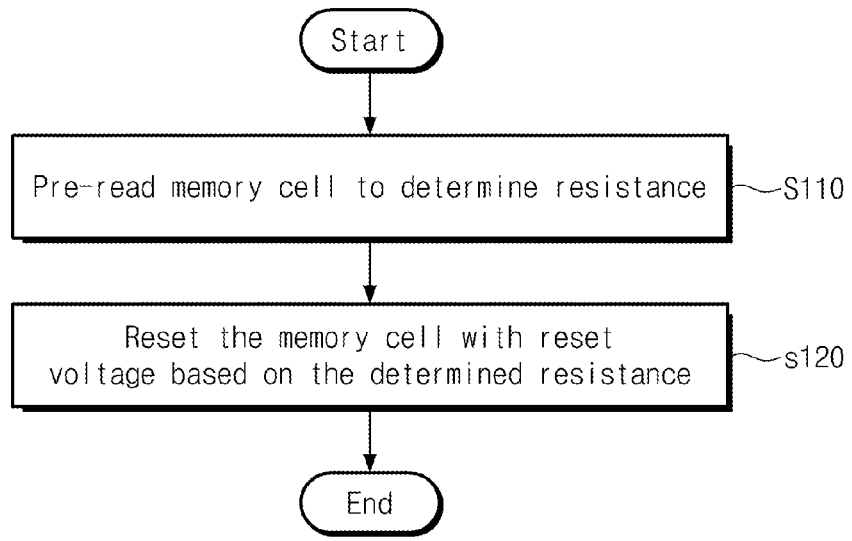
FIG. 8 is a flow chart summarizing a reset method according to embodiments of the inventive concept.

FIG. 8 is a flow chart summarizing a memory cell reset method according to embodiments of the inventive concept. Here, the variable resistance memory cells of a nonvolatile memory device are assumed to have been programmed to different resistance values in accordance with different compliance currents.

In the illustrated method, a pre-read operation is executed to determine the resistance (or a resistance range) for the selected memory cell (S110). Then, the level of a reset voltage is determined based on the resistance (or resistance range) determined by the pre-read operation (S120). Thus, an appropriate reset operation for the selected memory cell may be performed using a particular reset voltage. For example, the higher the resistance value (or resistance range) of the selected memory cell read during the pre-read operation, the lower the level of reset voltage will be.

Figure 9:
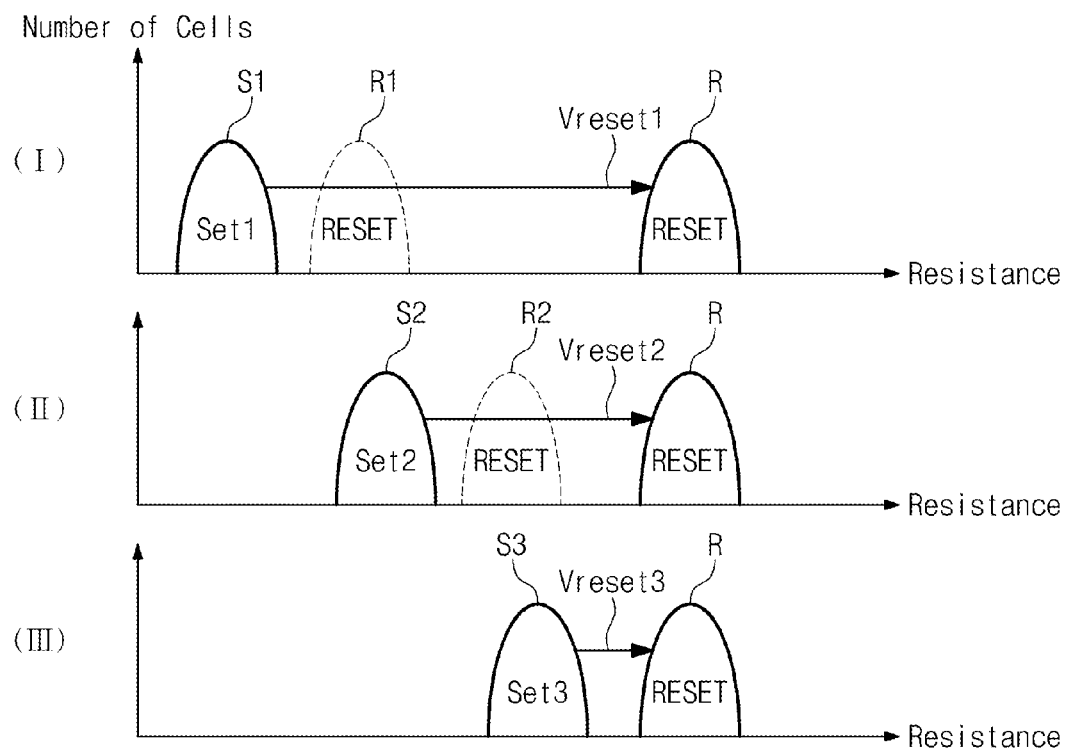
FIG. 9 is a conceptual diagram further illustrating the reset method of FIG. 8.

FIG. 9 is a set of conceptual diagrams (I), (II) and (III) further illustrating the reset method of FIG. 8. In FIG. 9, the horizontal axis indicates resistance value, and the vertical axis indicates a number of memory cells.

In diagram (I), a first set state S1 indicates a distribution of memory cells programmed to a set state using a first compliance current. In diagram (II), a second set state S2 indicates a distribution of memory cells programmed to a set state using a second compliance current less than the first compliance current. And in diagram (III), a third set state S3 indicates a distribution of memory cells programmed to a set state using a third compliance current less than the second compliance current.

As shown in FIG. 9, the first, second and third set states (S1, S2 and S3) have different resistance ranges. Thus, different resistance ranges for the first, second, and third reset states R1, R2, and R would conventionally be formed using the same reset voltage with respect to the first to third set states S1 to S3.

However, nonvolatile memory devices and memory cell reset methods according to embodiments of the inventive concept perform a pre-read operation with respect to a selected memory cell in order to determine a set resistance value for the selected memory cell. Then, the appropriate level of a reset voltage may be determined based on the determined set resistance value.

For example and as illustrated in FIG. 9, if the pre-read operation results indicate that the state of the selected memory cell is the first set state S1, the nonvolatile memory device 100 will reset the selected memory cell using a first reset voltage Vreset1. If the pre-read operation results indicate that the state of the selected memory cell is the second set state S2, the nonvolatile memory device 100 will reset the selected memory cell using a second reset voltage Vreset2 less than the first reset voltage Vreset1. And if the pre-read operation results indicate that the state of the selected memory cell is the third set state S3, the nonvolatile memory device 100 will reset the memory cells using a third reset voltage Vreset3 less than the second reset voltage Vreset2.

In this manner, the nonvolatile memory device 100 may reset memory cells, which have been programmed to a set state using different levels of compliance currents, using different reset voltages, based on a resistance value determined during a pre-read operation. Thus, the nonvolatile memory device 100 programs memory cells, which are programmed to a set state using different levels of compliance currents, to the same reset state using the pre-read operation.

Figure 10:
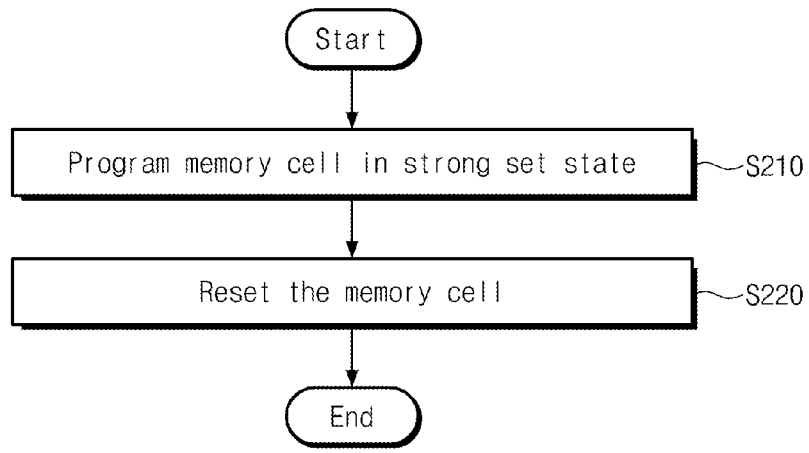
FIG. 10 is a flow chart summarizing a reset method according to other embodiments of the inventive concept.

FIG. 10 is a flow chart summarizing a memory cell reset method according to embodiments of the inventive concept that omit the necessity of performing the pre-read operation.

Here, a pre-set (write) program operation directed to the selected memory cell is performed (S210). The pre-set program operation is an operation that enables the selected memory cell to first be programmed to a "strong set state" using a relatively high compliance current, where the strong set state is characterized by a set state having a relatively low resistance value. Then, a reset operation is performed on the pre-set, selected memory cell (S220).

With the reset method described with reference to FIG. 10, variable resistance memory cells previously programmed to a set state using different levels of compliance currents may be programmed to the same set state via the pre-set program operation. Thus, nonvolatile memory devices like the one describe in relation to FIG. 7 may perform a reset operation on variable resistance memory cells to be programmed to the same set state, despite the fact that the nonvolatile memory device 100 previously programmed the variable resistance memory cells to a set state using different levels of compliance currents. Since the reset operation is performed using a constant level reset voltage, the nonvolatile memory device 100 reduces interference among memory cells, thereby improving endurance of memory cells.

Figure 11:
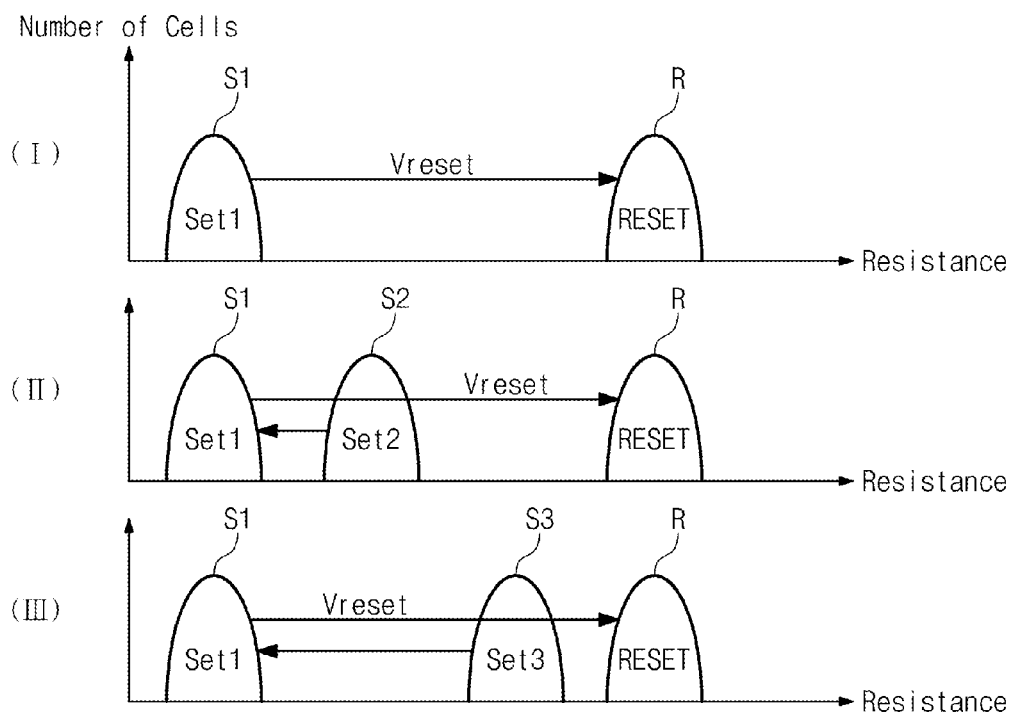
FIG. 11 is a conceptual diagram further illustrating the reset method of FIG. 10.

FIG. 11 is a set of conceptual diagrams, similar to FIG. 9, that further describes the reset method of FIG. 10.

In diagram (I) of FIG. 11, a first set state S1 indicates a distribution of memory cells programmed to a set state using a first compliance current. In diagram (II) of FIG. 11, a second set state S2 indicates a distribution of memory cells programmed to a set state using a second compliance current less than the first compliance current. And in diagram (III) of FIG. 11, a third set state S3 indicates a distribution of memory cells programmed to a set state using a third compliance current less than the second compliance current.

Referring to FIGS. 7 and 10, the nonvolatile memory device 100 may perform a pre-set program operation on a selected memory cell to program the selected memory cell to the first set state S1, and then program the selected memory cell having the first reset state S1 to a reset state R using a constant reset voltage Vreset.

Consistent with the above-described reset method of FIG. 11, the nonvolatile memory device 100 may program memory cells, previously programmed to a set state using different levels of compliance currents, to the same reset state using a constant reset voltage.

Figure 12:
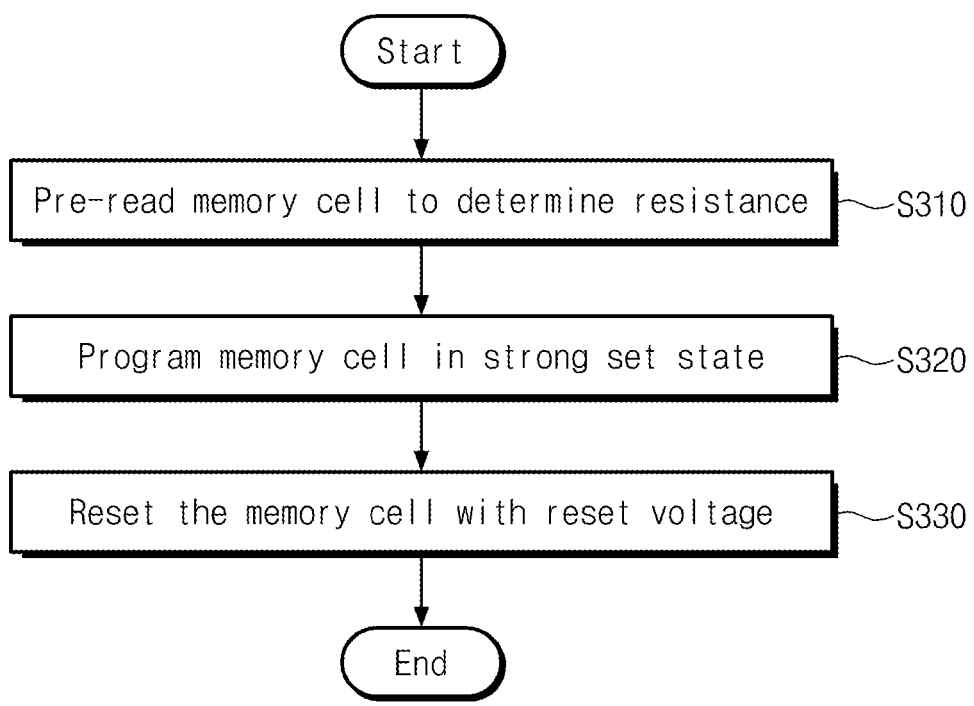
FIG. 12 is a flow chart summarizing a reset method according to still other embodiments of the inventive concept.

FIG. 12 is a flow chart summarizing still another reset method according to certain embodiments of the inventive concept. Here, variable resistance memory cells of a nonvolatile memory device previously programmed to the set state according to various resistance values may be programmed to the same reset state using a pre-read operation and a pre-set program operation.

That is, a pre-read operation directed to a selected memory cell may be performed to determine a set resistance value for the selected memory cell (S310).

In certain embodiments of the inventive concept, the pre-read operation may be performed in response to an external command. Referring to FIG. 7, for example, the nonvolatile memory device 100 may include a register that stores a flag, wherein the flag is set in the register in response to the external command and the nonvolatile memory device 100 selectively performs the pre-read operation based on a value of the flag.

In other embodiments of the inventive concept, the pre-read operation may be performed periodically. For example, the nonvolatile memory device 100 may include counter that counts a number of reset operations. Once the nonvolatile memory device 100 performs a predetermined number of reset operations the pre-read operation will be performed.

However initiated, once the pre-read operation is performed, a pre-set program operation directed to the selected memory cell is performed (S320). The pre-set program operation is an operation that enables the selected memory cell to be programmed to a strong set state like the one previously described.

In this manner, a compliance current and a voltage that are provided to the selected memory cell during the pre-set program operation may be set based on a set resistance value of a memory cell determined in step S310. Also, the pre-set program operation may be performed selectively based on a set resistance value of the memory cell determined in step S310. For example, if there is determined, at a pre-read operation, that the selected memory cell has a first set state, the pre-set program operation of step S320 is not performed.

Then, a reset operation directed to the selected memory cell is performed (S330).

With the above-described reset method, the nonvolatile memory device 100 is able to program variable resistance memory cells previously programmed to a set state using different levels of compliance currents, to the same set state using the pre-set program operation. Nonvolatile memory devices consistent with the inventive concept improve the effective lifetime of constituent variable resistance memory cells by selecting a compliance current and a voltage provided during the pre-set program operation based on a resistance value of the memory cell determined using the pre-read operation.

Figure 13:
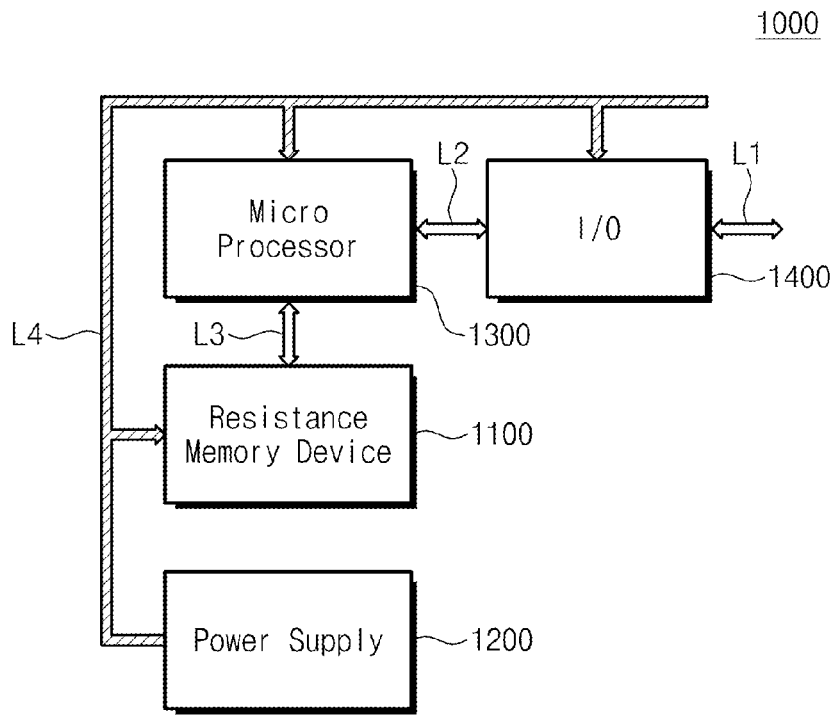
FIG. 13 is a block diagram illustrating a handheld electronic system to which a resistive memory device being a nonvolatile memory device according to an embodiment of the inventive concept is applied.

FIG. 13 is a block diagram illustrating a handheld electronic system 1000 to which a resistive memory device being a nonvolatile memory device according to an embodiment of the inventive concept is applied. A resistive memory device 1100 may program memory cells, which are programmed to a set state using different levels of compliance currents, to the same reset state, thereby securing reliability at sensing.

The resistive memory device 1100 connected to a microprocessor 1300 through a bus line L3 may be used as a main memory of the handheld electronic system 1000. A power supply 1200 may supply a power to the microprocessor 1300, an input/output device 1400, and the resistive memory device 1100 through a power line L4. Here, the microprocessor 1300 and the input/output device 1400 may constitute a memory controller for controlling the resistive memory device 1100.

In the event that input data is provided to the input/output device 1400 through a line L1, the microprocessor 1300 may receive and process the input data through a line L2 to output the processed result to the resistive memory device 1100 through a bus line L3. The resistive memory device 1100 may store data provided through the bus line L3 in memory cells. Data stored in memory cells may be read by the microprocessor 1300, and the read data may be output to an external device through the input/output device 1400.

Although a power of the power supply 1200 is not supplied to the power line L4, data stored in the resistive memory device 1100 may be retained. The reason may be that the resistive memory device 1100 is a nonvolatile memory unlike a DRAM. The resistive memory device 1100 may be advantageous in terms of an operating speed and power consumption as compared to other memory devices.

Figure 14:
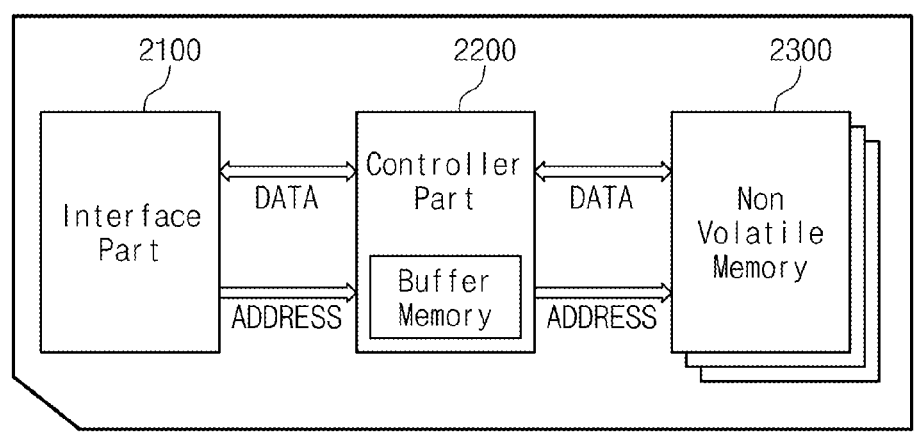
FIG. 14 is a block diagram illustrating a memory card including a nonvolatile memory device according to an embodiment of the inventive concept.

FIG. 14 is a block diagram illustrating a memory card including a nonvolatile memory device according to an embodiment of the inventive concept. A memory card 2000, for example, may be an MMC card, an SD card, a multiuse card, a micro-SD card, a memory stick, a compact SD card, an ID card, a PCMCIA card, an SSD card, a chip-card, a smartcard, an USB card, or the like.

Referring to FIG. 14, the memory card 2000 includes an interface circuit 2100 for interfacing with an external device, a controller 2200 including a buffer memory and controlling an operation of the memory card 2000, and at least one nonvolatile memory device 2300 according to embodiments of the inventive concept. The controller 2200 is a processor, which is configured to control write and read operations of the nonvolatile memory device 2300. The controller 2200 is coupled with the nonvolatile memory device 2300 and the interface circuit 2100 via a data bus and an address bus.

The nonvolatile memory device 2300 may program memory cells, which are programmed to a set state using different levels of compliance currents, to the same reset state, thereby securing reliability at sensing.

Figure 15:
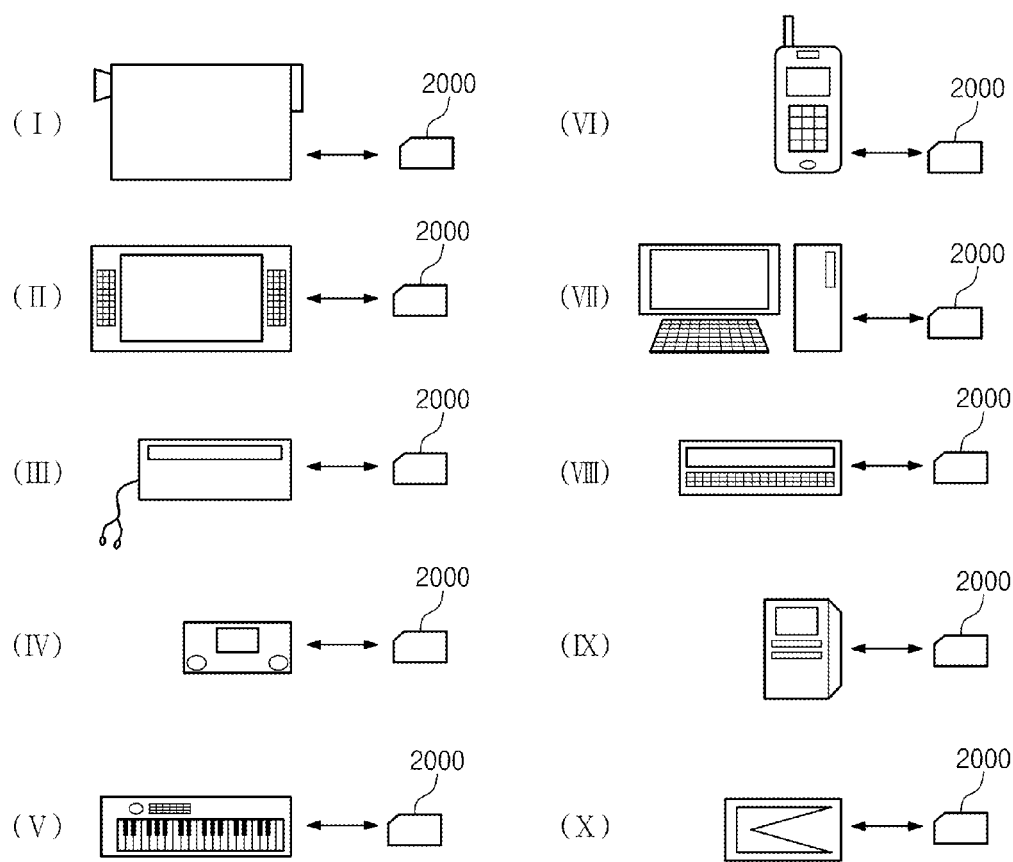
FIG. 15 is a diagram illustrating various systems to which a memory card in FIG. 14 is applied.

FIG. 15 is a diagram illustrating various systems to which a memory card in FIG. 14 is applied. Referring to FIG. 15, a memory card 2000 may be applied to a video camera (I), a television (II), an audio device (III), a game machine (IV), an electronic music device (V), a cellular phone (VI), a computer (VII), a Personal Digital Assistant (VIII), a voice recorder (IX), a PC card (X), and so on.

A nonvolatile memory device according to the inventive concept may be packaged according to any of a variety of different packaging technologies. Examples of such packaging technologies may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The described embodiments of the inventive concept may be modified or changed variously. For example, detailed structures of a memory cell array, a write driver, a sense amplifier, and control logic may be changed or modified variously according to environment and use. While the inventive concept has been described with reference to exemplary embodiments, it will be apparent to those skilled in the art that various changes and modifications may be made without departing from the scope of the following claims. Therefore, it should be understood that the above embodiments are not limiting, but illustrative.

What is claimed is:

1. A method of programming a variable resistance memory cell in a nonvolatile memory device, the method comprising:
    programming the variable resistance memory cell to one of a plurality of set states using a corresponding one of a plurality of compliance currents;
    pre-reading the variable resistance memory cell to determine the resistance of the variable resistance memory cell; and
    programming the variable resistance memory cell to a reset state using a variable reset voltage based on the determined resistance of the variable resistance memory cell, wherein
    the variable reset voltage is one of a plurality of reset voltages respectively corresponding to the plurality of set states.

2. The method of claim 1, wherein the determined resistance of the variable resistance memory cell is one of a plurality of resistance ranges respectively corresponding to the plurality of set states.

3. The method of claim 2, wherein the plurality of set states comprises a first set state indicated by a first resistance range, a second set state indicated by a second resistance range greater than the first resistance range, and a third set state indicated by a third resistance range greater than the second resistance range.

4. The method of claim 3, wherein the plurality of reset voltages comprises a first reset voltage used to reset the variable resistance memory cell to the reset state when programmed to the first set state, a second reset voltage less than the first reset voltage and used to reset the variable resistance memory cell to the reset state when programmed to the second set state, and a third reset voltage less than the second reset voltage and used to reset the variable resistance memory cell to the reset state when programmed to the third set state.

5. The method of claim 4, wherein the variable resistance memory cell is programmed to the first set state using a first compliance current, the variable resistance memory cell is programmed to the second set state using a second compliance current greater than the first compliance current, and the variable resistance memory cell is programmed to the third set state using a third compliance current greater than the second compliance current.

6. The method of claim 1, wherein the pre-read operation is performed in response to an external command received by the nonvolatile memory device.

7. The method of claim 1, wherein the pre-read operation is performed periodically.

8. The method of claim 1, wherein the variable resistance memory cell includes a data storage film comprising a bipolar resistance memory material.

9. A method of programming a variable resistance memory cell in a nonvolatile memory device, the method comprising:

programming the variable resistance memory cell to one of a plurality of set states using a corresponding one of a plurality of compliance currents;

programming the variable resistance memory cell to a strong set state using a variable voltage based on a resistance of the variable resistance memory cell; and programming the variable resistance memory cell to a reset state from the strong set state using a constant reset voltage.

10. The method of claim 9, wherein:

the plurality of set states comprises a first set state indicated by a first resistance range, a second set state indicated by a second resistance range greater than the first resistance range, and a third set state indicated by a third resistance range greater than the second resistance range, and the variable resistance memory cell is programmed to the first set state using a first compliance current, the variable resistance memory cell is programmed to the second set state using a second compliance current greater than the first compliance current, and the variable resistance memory cell is programmed to the third set state using a third compliance current greater than the second compliance current.

11. The method of claim 9, wherein the nonvolatile memory device comprises a memory cell array including the variable resistance memory cell, the memory cell array being arranged in a three-dimensional structure.

12. A method of programming a variable resistance memory cell in a nonvolatile memory device, the method comprising:

programming the variable resistance memory cell to one of a plurality of set states using a corresponding one of a plurality of compliance currents;

pre-reading the variable resistance memory cell to determine the resistance of the variable resistance memory cell;

programming the variable resistance memory cell to a strong set state using a variable voltage based on the determined resistance of the variable resistance memory cell; and programming the variable resistance memory cell to a reset state from the strong set state using a constant reset voltage.

13. The method of claim 12, wherein the determined resistance of the variable resistance memory cell is one of a plurality of resistance ranges respectively corresponding to the plurality of set states.

14. The method of claim 12, wherein the plurality of set states comprises a first set state indicated by a first resistance range, a second set state indicated by a second resistance range greater than the first resistance range, and a third set state indicated by a third resistance range greater than the second resistance range.

15. The method of claim 14, wherein the variable resistance memory cell is programmed to the first set state using a first compliance current, the variable resistance memory cell is programmed to the second set state using a second compliance current greater than the first compliance current, and the variable resistance memory cell is programmed to the third set state using a third compliance current greater than the second compliance current.

16. The method of claim 12, wherein the pre-read operation is performed in response to an external command received by the nonvolatile memory device.

17. The method of claim 12, wherein the pre-read operation is performed periodically.

18. The method of claim 12, wherein the variable resistance memory cell includes a data storage film comprising a bipolar resistance memory material.

19. The method of claim 12, wherein the nonvolatile memory device comprises a memory cell array including the variable resistance memory cell, the memory cell array being arranged in a three-dimensional structure.

* * * * *